(12) United States Patent
Lin et al.

(10) Patent No.: US 7,191,412 B1
(45) Date of Patent: Mar. 13, 2007

(54) METHOD AND APPARATUS FOR PROCESSING A CIRCUIT DESCRIPTION FOR LOGIC SIMULATION

(75) Inventors: Wei Lin, Santa Clara, CA (US); Sushama Ghanekar, San Jose, CA (US); Jimmy Zhenming Wang, Saratoga, CA (US); Kumar Deepak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/238,432

(22) Filed: Sep. 28, 2005

(51) Int. Cl.
*G06F 17/50* (2006.01)
(52) U.S. Cl. .......................................... 716/3; 716/12
(58) Field of Classification Search ............... 716/1, 716/3, 12
See application file for complete search history.

(56) References Cited

U.S. PATENT DOCUMENTS

| | | | |
|---|---|---|---|
| 6,080,204 A * | 6/2000 | Mendel | 716/7 |
| 6,505,328 B1 * | 1/2003 | Van Ginneken et al. | 716/7 |
| 6,574,787 B1 * | 6/2003 | Anderson | 716/18 |
| 6,996,793 B1 * | 2/2006 | Kronmiller et al. | 716/9 |
| 7,117,473 B1 * | 10/2006 | Knol et al. | 716/13 |
| 7,120,892 B1 * | 10/2006 | Knol et al. | 716/13 |
| 2002/0133784 A1 * | 9/2002 | Gupta et al. | 716/1 |

* cited by examiner

*Primary Examiner*—Stacy A Whitmore
(74) *Attorney, Agent, or Firm*—Robert Brush (57) ABSTRACT

Method and apparatus for processing a circuit description including a hierarchy of components for logic simulation is described. Each component is described using one of a first hardware description language (HDL) and a second HDL. A root component and each component in the hierarchy below the root component described using an HDL identical to that of the root component is elaborated up to a cross-language boundary. The root component is described using one of the first HDL or the second HDL and each component at the cross-language boundary is described using the other of the first HDL or the second HDL. Each component at the cross-language boundary is stored in one of a first vector associated with the first HDL or a second vector associated with the second HDL based on language. A connection is established between each component at the cross-language boundary and a respective parent component.

20 Claims, 9 Drawing Sheets

METHOD AND APPARATUS FOR PROCESSING A CIRCUIT DESCRIPTION FOR LOGIC SIMULATION

FIELD OF THE INVENTION

One or more aspects of the present invention relate generally to computer aided circuit design systems and, more particularly, to a method and apparatus for processing a circuit description for logic simulation.

BACKGROUND OF THE INVENTION

Hardware Description Languages (HDLs), such as the Very high-speed integrated circuit Hardware Description Language (VHDL) or VERILOG are text-based approaches to digital logic design through behavioral and/or structural description of design elements. HDL can be used to design: (1) a programmable logic device (PLD), such as a field programmable gate array (FPGA) or complex programmable logic device (CPLD); (2) a mask programmable device, such as a hardwired programmable gate array (PGA), application-specific standard product (ASSP) or application specific integrated circuit (ASIC); (3) a system formed from selected electronic hardware components; or (4) any other electronic device. The HDL-based approach to design requires the user to describe the behavior of a system, which can then be simulated to determine whether the design will function as desired. The design is then synthesized to create a logical network list ("netlist") that can be implemented within a particular device.

Many tools exist that allow electronic designs of integrated circuits (ICs) to be assembled, simulated, debugged, and translated into hardware. In general, an IC modeling system allows an IC design to be described and simulated with a HDL-level abstraction. For example, a designer produces an electronic representation of the IC design using a modeling system by connecting and arranging schematic representations of circuit elements on a computer display, then uses the modeling system to translate the electronic IC design to a lower level HDL description for simulation or realization in hardware.

A logic simulator is a software tool capable for performing functional and timing simulation of an HDL circuit design. Logic simulators perform the process of elaboration, in which a circuit description in HDL takes effect inside the logic simulator. The elaboration process constructs each logic component, assigns initial values to generics/parameters/signals, and establishes connections between logic components.

A circuit design often consists of many different components, possibly written in different HDLs. For example, a circuit design may have some components described using VHDL and other components described using VERILOG. Conventional logic simulators exist for simulating pure VHDL designs or pure VERILOG designs. Since circuit designs may be described using multiple HDLs, there exists a need for a logic simulator which simulates a mixed HDL description. One of the main challenges of VHDL/VERILOG mixed-language simulation is that VHDL and VERILOG have different elaboration semantics (i.e., they require different object construction, initial value calculation, and assignment order). Accordingly, there exists a need in the art for an improved method and apparatus that processes a mixed-language circuit description for logic simulation.

SUMMARY OF THE INVENTION

An aspect of the invention relates to a method of processing a circuit description for logic simulation. The circuit description includes a hierarchy of components. Each component in the hierarchy is described using one of a first hardware description language (HDL) and a second HDL. A component is selected in the hierarchy as a root component. The root component and each component in the hierarchy below the root component described using an HDL identical to that of the root component is elaborated up to a cross-language boundary. The root component is described using one of the first HDL or the second HDL and each component at the cross-language boundary is described using the other of the first HDL or the second HDL. Each component at the cross-language boundary is stored in one of a first vector associated with the first HDL or a second vector associated with the second HDL based on language. A connection is established between each component at the cross-language boundary and a respective parent component in the hierarchy. Another component is then removed from one of the first vector or the second vector. The steps of elaborating and establishing are performed using the other component as the root component. The steps of removing and performing are repeated until each of the first vector and the second vector is empty.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figures 1, 2:
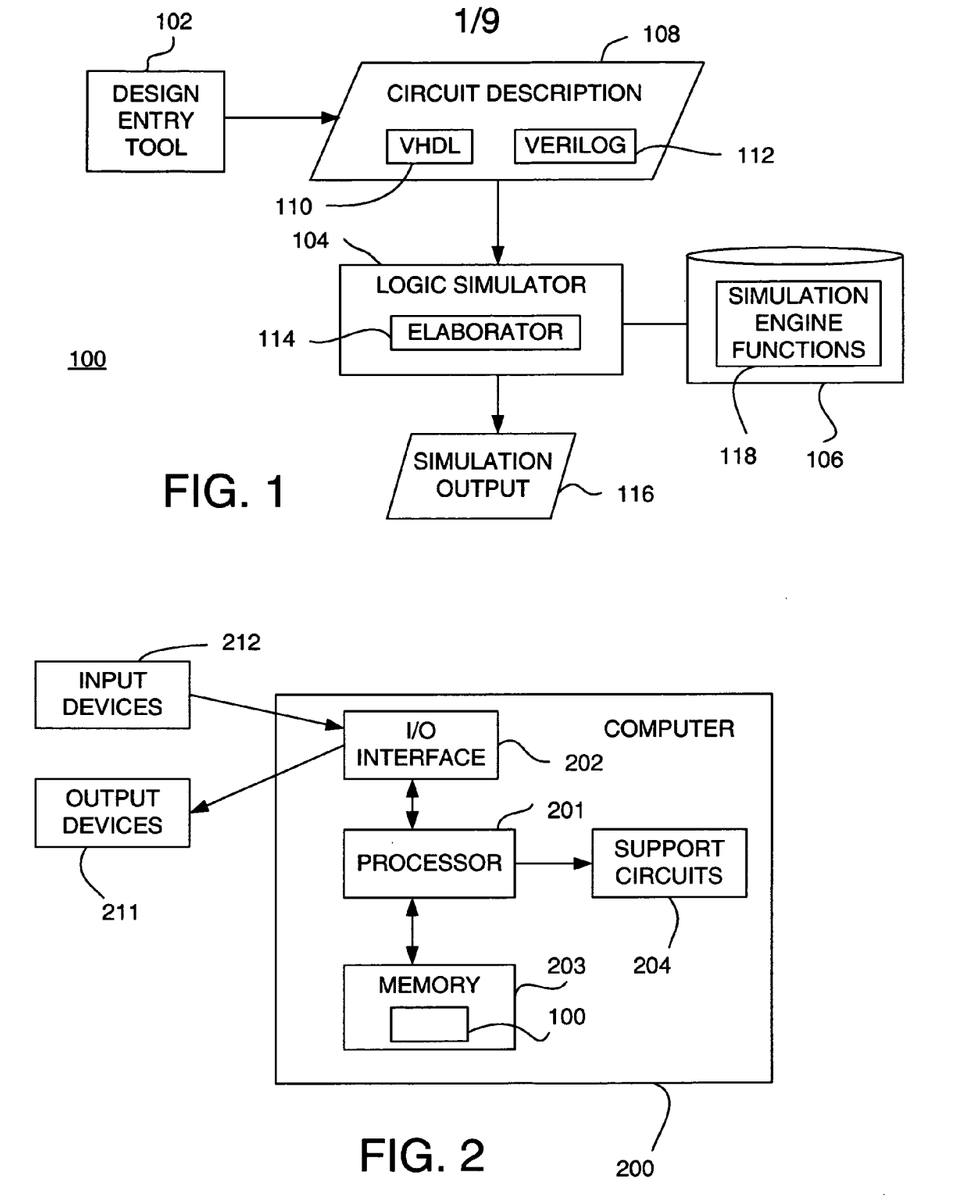
FIG. 1 is a block diagram depicting an exemplary embodiment of a circuit simulation system constructed in accordance with one or more aspects of the invention.
FIG. 2 is a block diagram depicting an exemplary embodiment of a computer suitable for implementing the processes and methods described herein.

FIG. 1 is a block diagram depicting an exemplary embodiment of a circuit simulation system 100 constructed in accordance with one or more aspects of the invention. The system 100 includes a design entry tool 102, a logic simulator 104, and a database 106. A designer uses the design entry tool 102 to produce a circuit description 108 that specifies a circuit. The circuit description 108 specifies the circuit using multiple hardware description languages (HDLs), i.e., the circuit description 108 is a mixed language description of the circuit. In present embodiment of FIG. 1, the circuit description 108 includes a VHDL portion 110 and a VERILOG portion 112.

Figure 8:
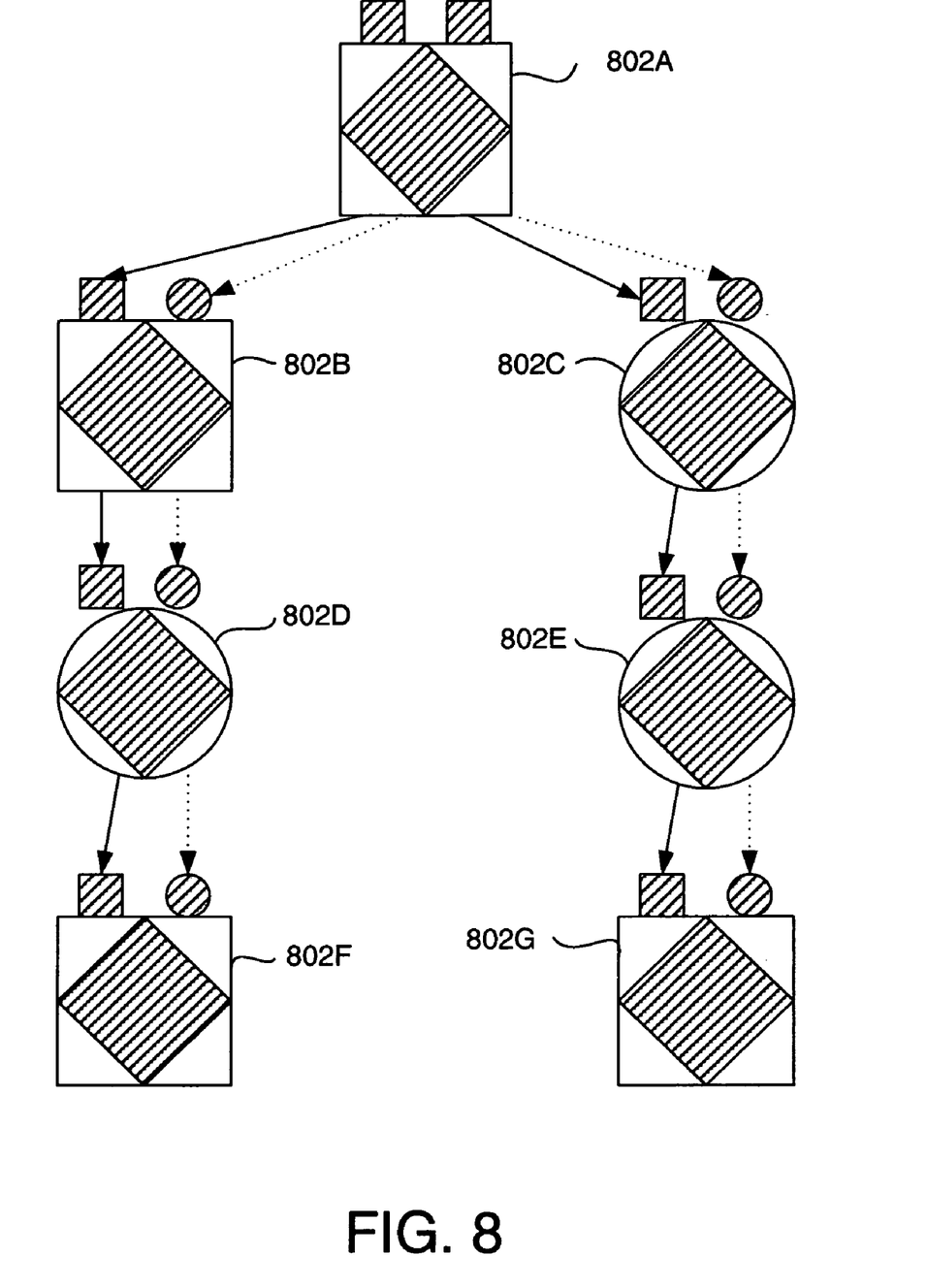
FIGS. 8–10 illustrate an exemplary circuit description throughout various stages of elaboration in accordance with one or more aspects of the invention.

An exemplary circuit description is shown in FIG. 8, which is described more fully below. In FIG. 8, VHDL components are represented by a large square and VERILOG components are represented by a large circle. Briefly stated, the exemplary circuit description includes VHDL components 802A, 802B, 802F, and 802G, and VERILOG components 802C, 802D, and 802E. The VHDL component 802B and the VERILOG component 802C are sub-components of the VHDL component 802A, which is the top level component. The VERILOG component 802D is a sub-component of the VHDL component 802B, and the VERILOG component 802E is a sub-component of the VERILOG component 802C. The VHDL component 802F is a sub-component of the VERILOG component 802D, and the VHDL component 802G is a sub-component of the VERILOG component 802E.

The example shown in FIG. 8 is one of a myriad of possible circuit design hierarchies. In general, a circuit design includes a top-level component, which may include one or more sub-components. Each of those sub-components may include one or more additional sub-components, which may include one or more additional sub-components, and so on. Each of the top-level component and the sub-components may be specified using one of a plurality of HDLs. Notably, the term "component" as used herein generally refers to a circuit or logic block, regardless of whether such circuit or logic block is defined using VHDL or VERILOG.

Returning to FIG. 1, the VHDL portion 110 includes one or more VHDL components. Each of the VHDL components may include one or more ports, an architecture, and one or more generics. As is well known in the art, an "architecture" in a VHDL description specifies operation and implementation of the component. The ports in a VHDL description describe the input/output interface of the component. A port serves as a channel for dynamic communication between a component and its environment. Optional generics in a VHDL description serve as a channel for static information to be communicated to the component from its environment. For example, a generic may be used to determine local constants used in the component, such as timing constraints and bus width constraints. The names of the ports and generics are referred to as "formals." An "actual" is an expression, a port, or a variable associated with a formal port or formal generic.

The VERILOG portion 112 includes one or more VERILOG components. Each of the VERILOG components may include one or more ports, a module definition ("module"), and one or more parameters. As is well known in the art, a "module" in a VERILOG description specifies operation and implementation of the component. The ports in a VERILOG description describe the input/output interface of the component and serve as a channel for dynamic communication between a component and its environment. Parameters are similar to VHDL generics in that they serve as a channel for static information to be communicated to the component from its environment. Similar to VHDL, the names of the ports and parameters are referred to as "formals." An "actual" is an expression, a port, or a variable associated with a formal port or formal parameter.

The circuit description 108 is coupled to the logic simulator 104 for simulation. The logic simulator 104 includes an elaborator 114. The elaborator 114 performs a mixed-language elaboration process in which each logic component of the circuit description 108 is constructed, initial values of generics, parameters, and/or signals are assigned, and connections between logic components are established. Exemplary embodiments of mixed-language elaboration processes are described below. After elaboration of the circuit description 108, the logic simulator 104 generates executable code based on a set of simulation engine functions 118 stored in the database 106 for simulating the circuit description 108. The logic simulator 104 generates simulation output 116 in response to the simulation.

FIG. 2 is a block diagram depicting an exemplary embodiment of a computer 200 suitable for implementing the processes and methods described herein. Notably, the computer 200 may be used to implement the simulation system 100 of FIG. 1, as well as the algorithms it performs. The computer 200 includes a processor 201, a memory 203, various support circuits 204, and an I/O interface 202. The processor 201 may be any type of microprocessor known in the art. The support circuits 204 for the processor 201 include conventional cache, power supplies, clock circuits, data registers, I/O interfaces, and the like. The I/O interface 202 may be directly coupled to the memory 203 or coupled through the processor 201. The I/O interface 202 may be coupled to various input devices 212 and output devices 211, such as a conventional keyboard, mouse, printer, display, and the like.

The memory 203 stores all or portions of one or more programs and/or data to implement the system 100. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 200 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 203. The memory 203 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 3:
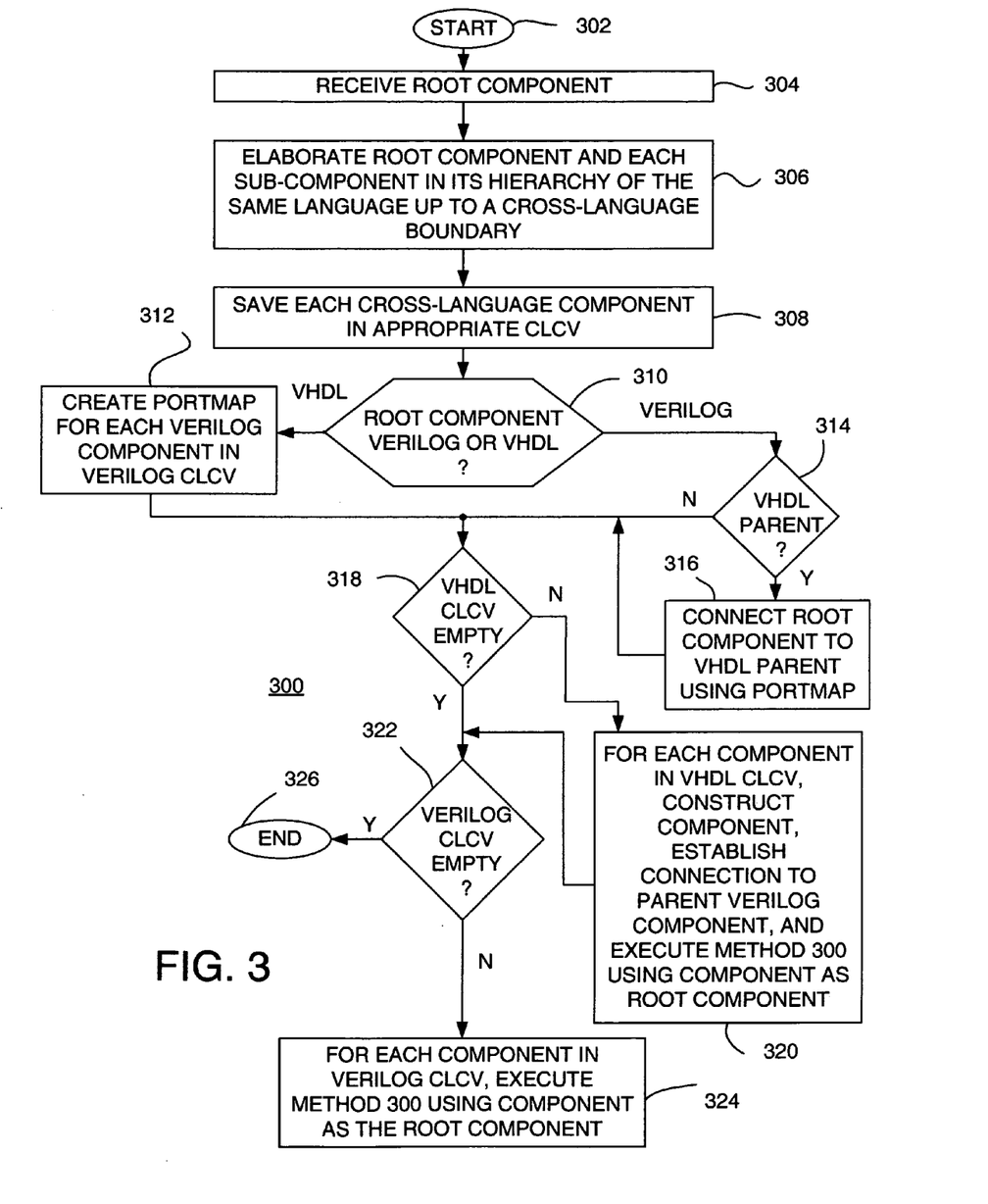
FIG. 3 is a flow diagram depicting an exemplary embodiment of a method of elaborating a mixed-language circuit description in accordance with one or more aspects of the invention.

FIG. 3 is a flow diagram depicting an exemplary embodiment of a method 300 of elaborating a mixed-language circuit description in accordance with one or more aspects of the invention. The method 300 begins at step. 302. At step. 304, a root component is received. As described below, the method 300 processes the hierarchy of the circuit description recursively. Initially, the root component is the top-level component of the circuit description. At step. 306, the root component and each sub-component of the same language of the root component in its hierarchy is elaborated up to a cross-language boundary. For example, referring to the example of FIG. 8, if the component 802A is the root component, then the components 802D and 802C are at a cross-language boundary, since the root component 802A is described using VHDL, and the components 802C and 802D are described using VERILOG. Note that, even though VHDL components 802F and 802G are technically in the hierarchy of the root component 802A, those components are not elaborated at this time, since they are on the other side of the cross-language boundary formed by the VERILOG components 802D and 802C.

At step. 308, each cross-language component at the cross-language boundary is saved in a cross-language component vector (CLCV) associated with the particular language of the cross-language components. That is, there is a VHDL CLCV and a VERILOG CLCV. At step. 310, a determination is made whether the root component is a VHDL component or a VERILOG component. If the root component is a VHDL component, the method 300 proceeds to step. 312. At step. 312, a portmap is created for each VERILOG component in the VERILOG cross-language component vector.

Notably, one of the important differences between VHDL and VERILOG elaboration is that the VERILOG parameter values must be calculated after the overall hierarchy has been constructed. This is due to the existence of VERILOG defparam and hierarchical reference language features. In contrast, VHDL generic values are required to be ready before the construction of lower level components. Since the size of a VHDL port may depend on the actual size of the signal, the connection from actual to formal must be done before the construction of the lower level components. In VERILOG, the passing of actual to formal port must be delayed until the parameter values are finalized. To facilitate this process, for each VERILOG module instantiated by a VHDL architecture, an ordered list is created (referred to as a portmap) to store mapping information from a VHDL signal to a VERILOG port. The method 300 proceeds from step. 312 to step. 318.

If, at step. 310, the root component is determined to be a VERILOG component, the method 300 proceeds to step. 314. At step. 314, a determination is made whether the selected VERILOG component has a VHDL parent component (i.e., whether the selected VERILOG component is a sub-component of a VHDL component). If not, the method 300 proceeds to step. 318. Otherwise, the method 300 proceeds to step. 316, where the root component is connected to the VHDL parent component using the associated portmap. Notably, when the parent VHDL component was elaborated, the VHDL component could not be connected to the VERILOG subcomponent, as discussed above. Rather, a portmap was created (i.e., step. 312). Since the root VERILOG component has been constructed during the elaboration step. 306, the parent VHDL component can now be connected to the selected VERILOG component. The portmap is used to establish the connections. The method 300 then proceeds to step. 318.

At step. 318, a determination is made whether the VHDL CLCV is empty. If not, the method 300 proceeds to step. 320. At step. 320, for each component in the VHDL CLCV: (a) the component is constructed; (b) a connection is established to a parent VERILOG component; (c) the component is removed from the VHDL CLCV; and (d) the method 300 is executed using the component as the root component. The method 300 then proceeds to step. 322. If, at step. 318, the VHDL CLCV is empty, the method 300 proceeds directly to step. 322.

At step. 322, a determination is made whether the VERILOG CLCV is empty. If not, the method 300 proceeds to step. 324. At step. 324, for each component in the VERILOG CLCV, the component is removed from the VERILOG CLCV and the method 300 is executed using the component as the root component. If, at step. 322, the VERILOG CLCV is empty, the method 300 ends at step. 326. Notably, the method 300 is a recursive algorithm that only ends if both the VHDL CLCV and the VERILOG CLCV are empty.

Figure 4:
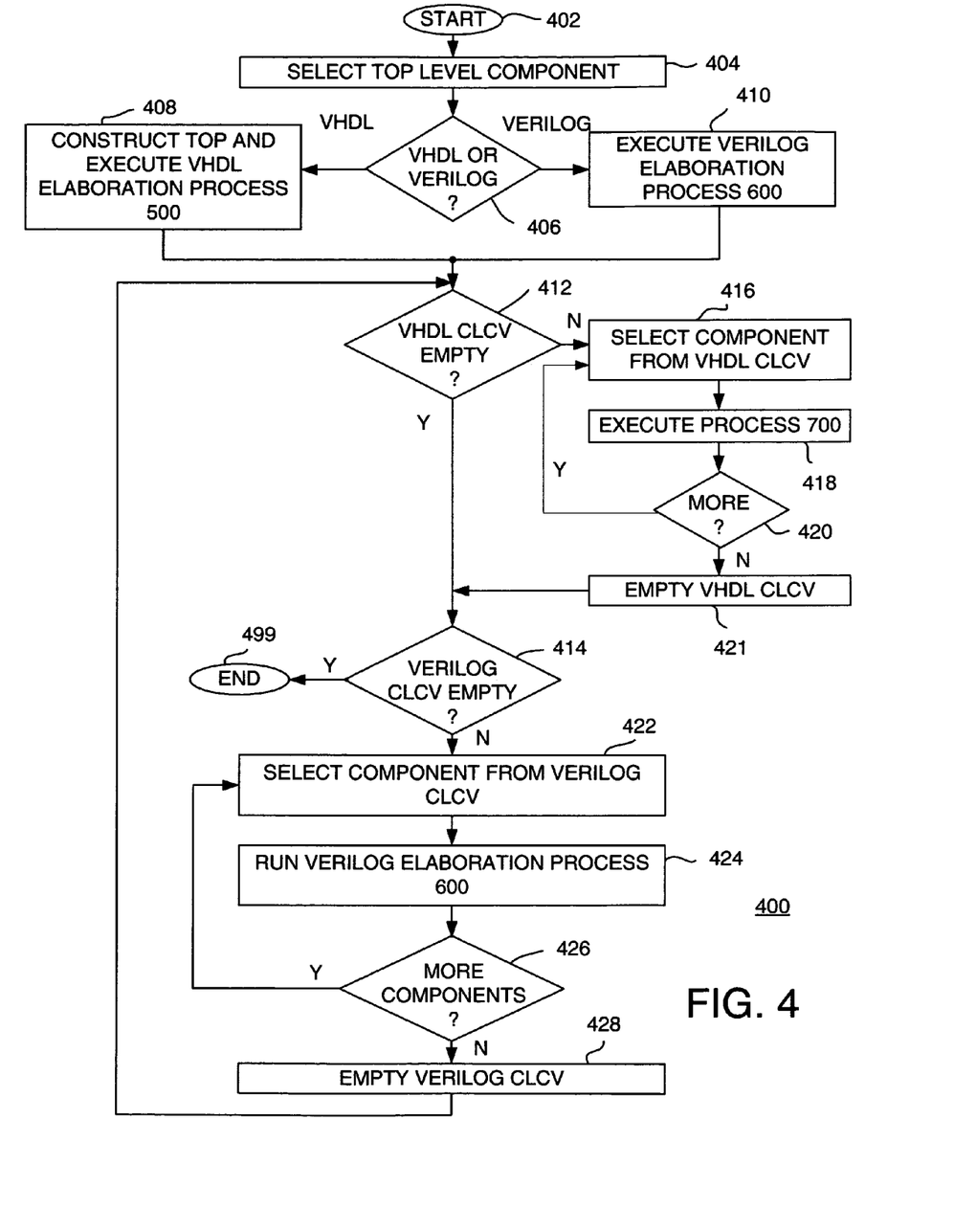
FIG. 4 is a more detailed flow diagram depicting an embodiment of a method of elaborating a mixed-language circuit description in accordance with one or more aspects of the invention.

FIG. 4 is a more detailed flow diagram depicting an embodiment of a method 400 of elaborating a mixed-language circuit description in accordance with one or more aspects of the invention. The method 400 begins at step. 402. At step 404, the top-level component of the circuit description is selected. At step. 406, a determination is made whether the top-level component is described using VHDL or VERILOG. If the top-level component is described using VHDL, the method 400 proceeds to step. 408, wherein a VHDL elaboration process 500 is executed using the top-level component as parametric input. An exemplary embodiment of the VHDL elaboration process 500 is described below with respect to FIG. 5. If the top-level component is described using VERILOG, the method 400 proceeds to step. 410, where a VERILOG elaboration process 600 is executed using the top-level component as parametric input. An exemplary embodiment of the VERILOG elaboration process 600 is described below with respect to FIG. 6.

Figure 5:
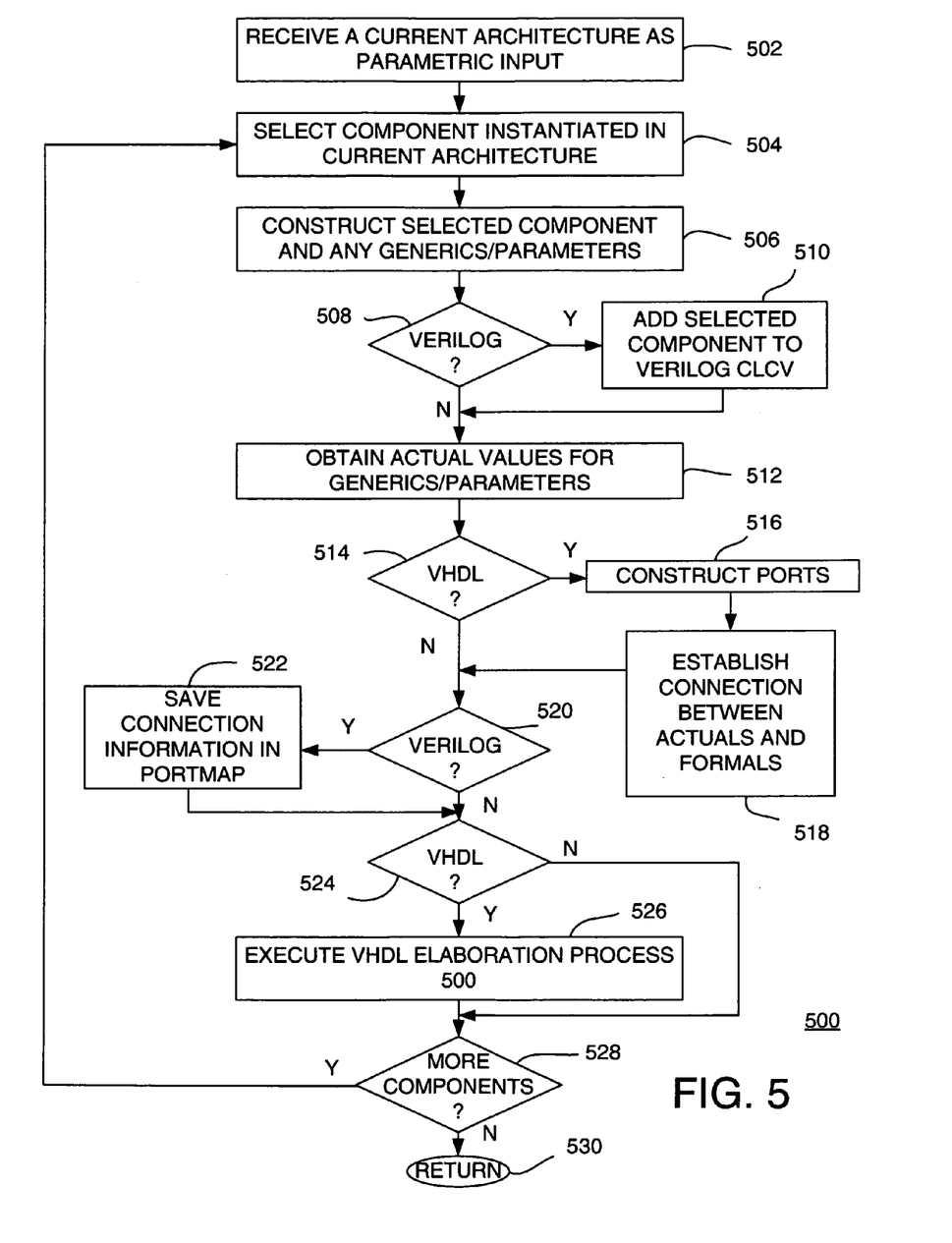
FIG. 5 is a flow diagram depicting an exemplary embodiment of a method for elaborating a VHDL circuit description in accordance with one or more aspects of the invention.

FIG. 5 is a flow diagram depicting an exemplary embodiment of a method 500 for elaborating a VHDL circuit description in accordance with one or more aspects of the invention. The method 500 begins at step. 502, where a current architecture is received as parametric input. The current architecture is the architecture of the component selected in the method 400 at either step. 402 or step. 414. At step. 504, a component instantiated in the current architecture is selected. At step. 506, the selected component and any generics (for VHDL) or parameters (for VERILOG) associated therewith is/are constructed.

At step. 508, a determination is made whether the selected component is described using VERILOG. If so, the method 500 proceeds to step. 510. At step. 510, the selected component is added to a VERILOG cross-language component vector (CLCV). The method 500 then proceeds to step. 512. If, at step. 508, the selected component is not described using VERILOG, the method 500 proceeds directly to step. 512. At step. 512, the actual values for the generics or parameters (if any) are obtained. At step. 514, a determination is made whether the selected component is described using VHDL. If so, the method 500 proceeds to step. 516.

At step. 516, the ports (if any) of the selected components are constructed. At step. 518, a connection is established between each formal port and actual port. The method 500 then proceeds to step. 520. If, at step. 514, the selected component is not described using VHDL, the method 500 proceeds directly to step. 520. At step 520, a determination is made whether the selected component is described using VERILOG. If so, the method 500 proceeds to step. 522. At step. 522, connection information is saved in a portmap. As described above, it is necessary create an ordered list (portmap) to store mapping information from a VHDL signal to a VERILOG port for each VERILOG module instantiated by a VHDL architecture. The method 500 then proceeds to step. 524. If, at step. 520, the selected component is not described using VERILOG, the method 500 proceeds directed to step. 524.

At step. 524, a determination is made whether the selected component is described using VHDL. If so, the method 500 proceeds to step. 526, where the VHDL elaboration process 500 is executed using the selected component as parametric input. That is, the method 500 is recursively executed. The method 500 then proceeds to step. 528. If, at step. 524, the selected component is not described using VHDL, the method 500 proceeds directly to step. 528. At step. 528, a determination is made whether there are any more components in the current architecture that have not been elaborated. If so, the method 500 returns to step. 504. Otherwise, the method 500 ends at step. 530. Notably, the process 500 is recursively executed to construct each VHDL component in the current architecture until a cross-language boundary is reached.

Figure 6:
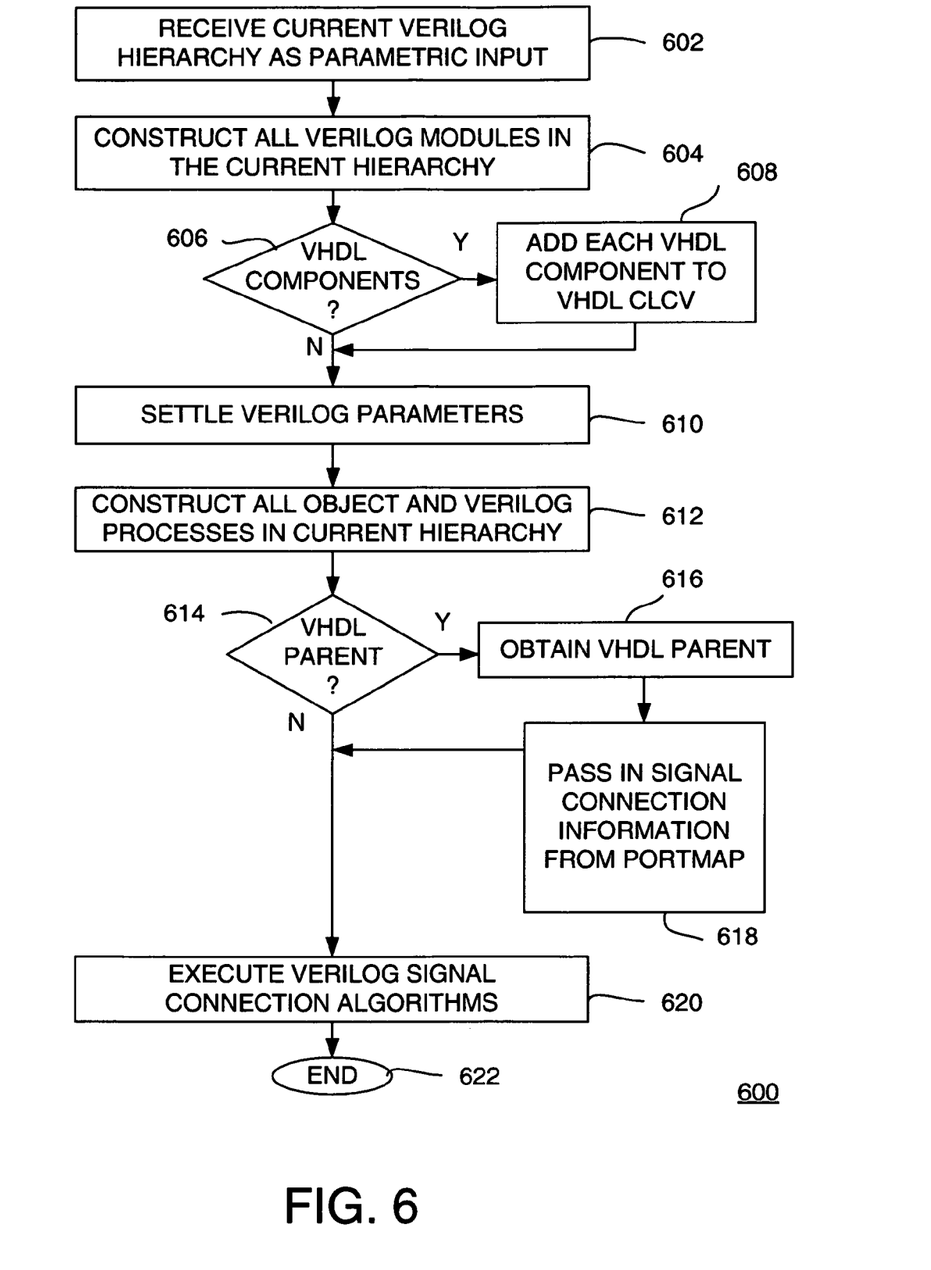
FIG. 6 is a flow diagram depicting an exemplary embodiment of a method for elaborating a VERILOG circuit description in accordance with one or more aspects of the invention.

FIG. 6 is a flow diagram depicting an exemplary embodiment of a method 600 for elaborating a VERILOG circuit description in accordance with one or more aspects of the invention. The method 600 begins at step. 602, where a current hierarchy is received as parametric input. The current hierarchy is the hierarchy of the component selected in the method 400 at either step. 402 or step. 422. At step. 604, all VERILOG modules in the current hierarchy are constructed. At step. 606, a determination is made whether the current hierarchy includes any VHDL components. If so, the method 600 proceeds to step. 608, where each identified VHDL component is added to a VHDL CLCV. The method 600 then proceeds to step. 610. If, at step 606, the current hierarchy does not include any VHDL components, the method 600 proceeds directly to step. 610.

At step. 610, parameter settling algorithms are executed. At step. 612, all object and VERILOG processes in the current hierarchy are constructed. At step. 614, a determination is made whether the current hierarchy is part of a VHDL parent component. If so, the method 600 proceeds to step. 616, where the VHDL parent component of the current VERILOG hierarchy is obtained. At step. 618, signal connection information in the VHDL to VERILOG port map vector corresponding to the current hierarchy and the VHDL parent component is passed in. The method 600 then proceeds to step. 620. If, at step. 614, the current hierarchy is not part of a VHDL parent component, the method 600 proceeds directly to step. 620. At step. 620, VERILOG signal connection algorithms are executed. The method 600 then ends at step. 622.

Returning to FIG. 4, the method 400 proceeds from step. 408 and 410 to step. 412. At step. 412, a determination is made whether the VHDL CLCV is empty. If so, the method proceeds to step. 414. Otherwise, the method 400 proceeds to step 416. At step. 416, a component is selected from the VHDL CLCV. At step. 418, a process 700 is executed to elaborate the selected component. An exemplary embodiment of the process 700 is described below with respect to FIG. 7. At step 420, a determination is made whether there are more components in the VHDL CLCV. If so, the method 400 returns to step. 416 and repeats. Otherwise, the method 400 proceeds to step. 421. At step. 421, the VHDL CLCV is emptied (i.e., the components are removed from the VHDL CLCV). The method 400 then proceeds to step. 414.

At step. 414, a determination is made whether the VERILOG CLCV is empty. If so, the method 400 ends at step. 499. Otherwise, the method 400 proceeds to step 422. At step. 422, a component is selected from the VERILOG CLCV. At step. 424, the VERILOG elaboration process 600 is executed using the selected component as parametric input. At step. 426, a determination is made whether there are more components in the VERILOG CLCV. If so, the method 400 returns to step. 422 and repeats. Otherwise, the method 400 proceeds to step. 428. At step. 428, the VERILOG CLCV is emptied (i.e., the components are removed from the VERILOG CLCV). The method 400 then returns to step. 412 and repeats.

Figure 7:
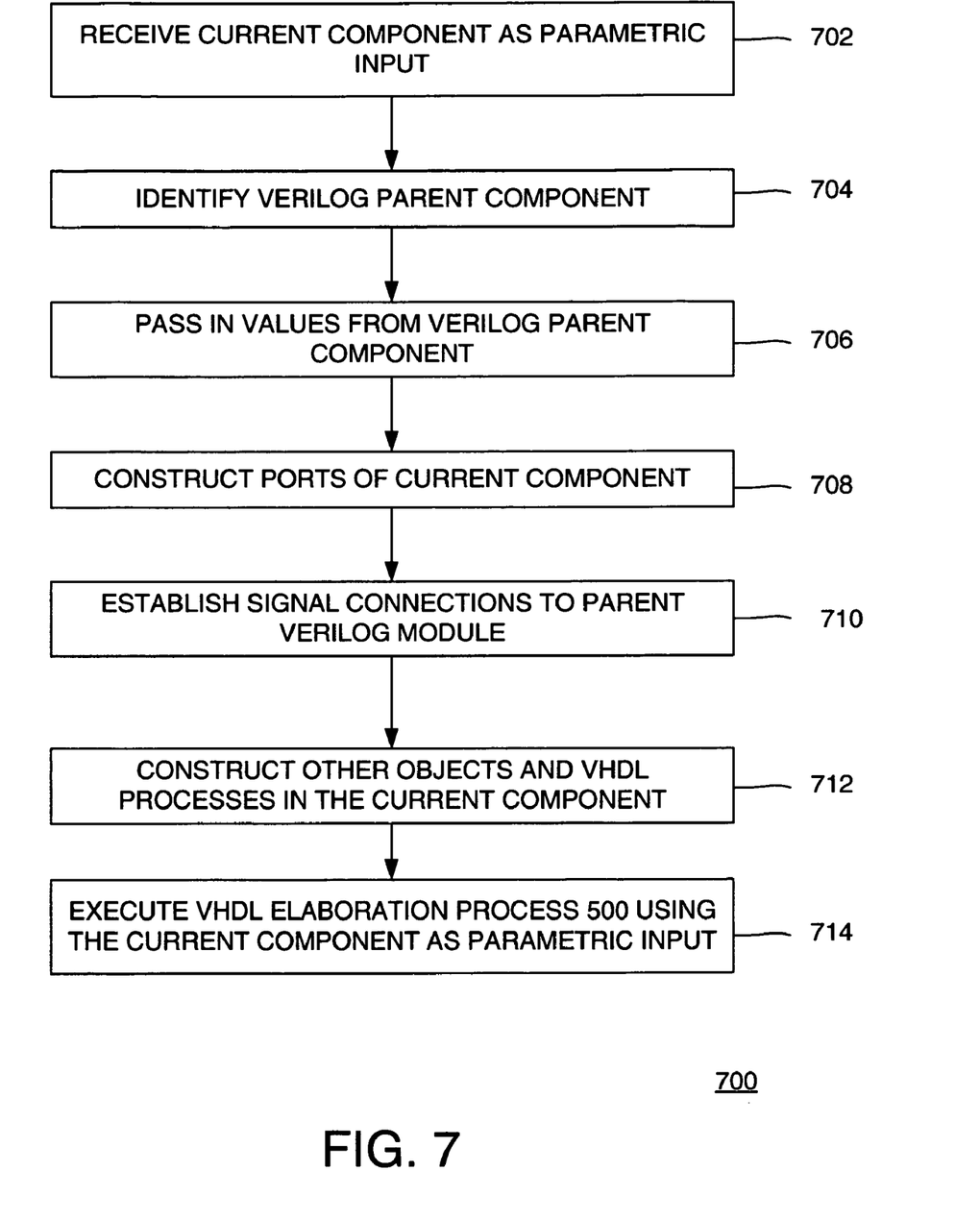
FIG. 7 is a flow diagram depicting an exemplary embodiment of the process performed in the method 400 of FIG. 4 in accordance with one or more aspects of the invention.

FIG. 7 is a flow diagram depicting an exemplary embodiment of the process 700 in accordance with one or more aspects of the invention. The process 700 begins at step. 702, where a current component is received as parametric input. The current component corresponds to the selected component from step. 416. At step. 704, the VERILOG parent component of the current component is identified. At step. 706, values for the parameters are passed in from the parent VERILOG module. At step 708, ports of the current component are constructed. At step. 710, the port connection function of the parent VERILOG module is called to establish signal connections. At step. 712, other objects and VHDL processes are constructed in the current component. At step. 714, the VHDL elaboration process 500 is executed using the current component as parametric input.

Figure 9:
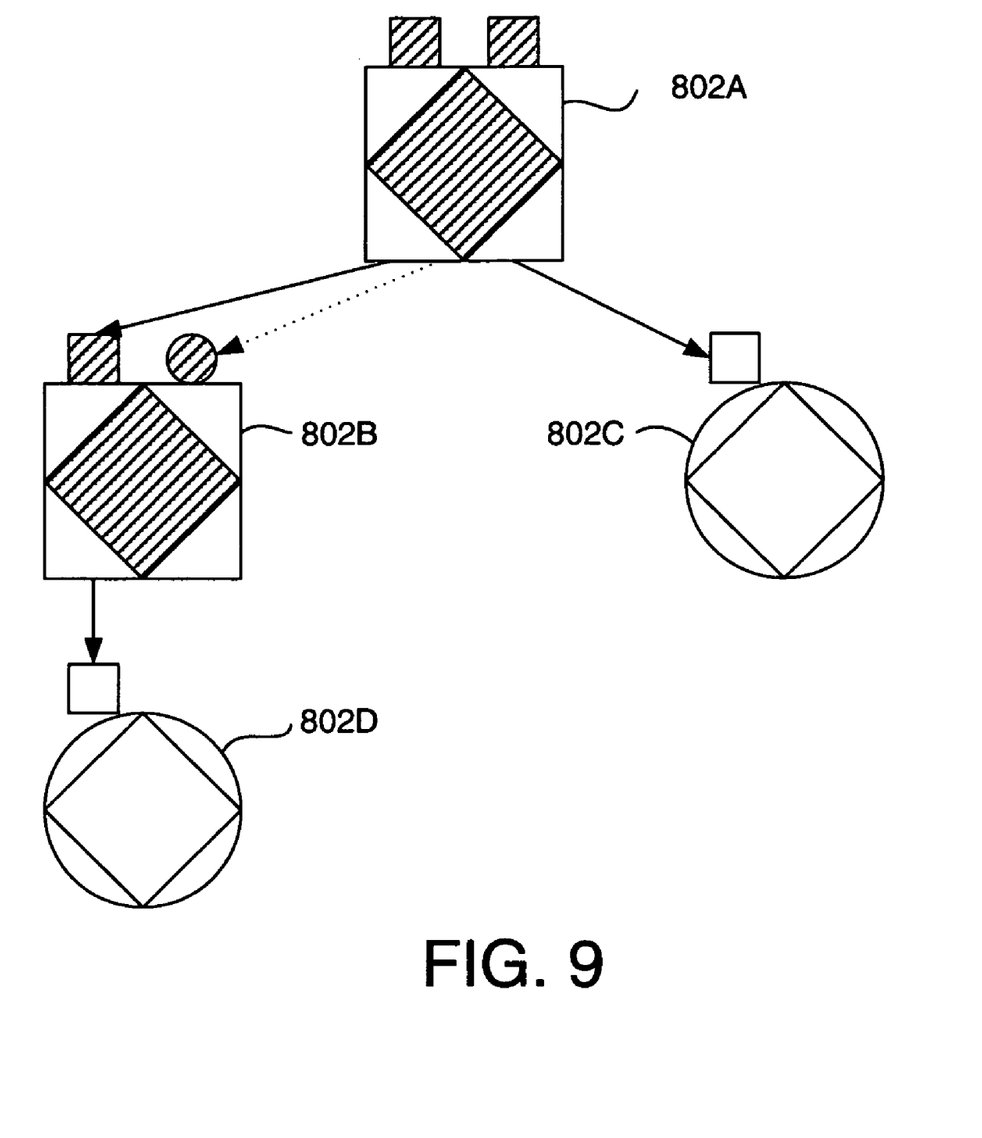
Figure 10:
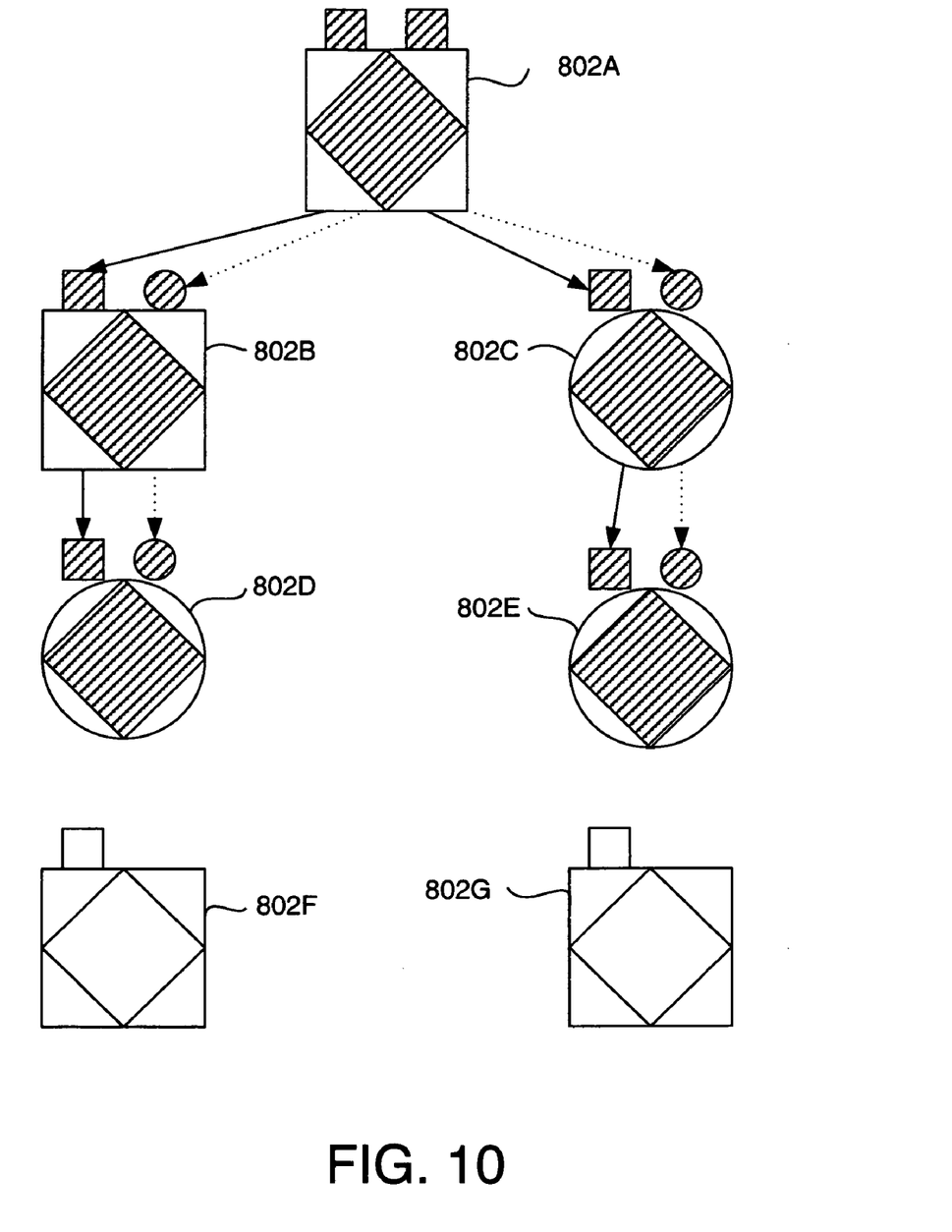

The mixed language elaboration algorithm 400 of an embodiment of the present invention may be understood with reference to the following example and FIGS. 8–10. In FIGS. 8–10, VHDL components are represented by a large square and VERILOG components are represented by a large circle. Fully constructed internal objects are represented by a hatched diamond. Internal objects that are not constructed are represented by an empty diamond. Generic passing is represented by a solid arrow, and port connection is represented by a dotted arrow. Generics with a final value are represented by a hatched small square, and generics without a final value are represented by an empty small square. Fully constructed ports with proper connections are represented by a small hatched circle.

FIG. 8 illustrates a fully elaborated mixed-language circuit description. As described briefly above, the circuit description includes the VHDL components 802A, 802B, 802F, and 802G, and the VERILOG components 802C, 802D, and 802E. Since the VHDL component 802A is the top-level component in this description, the VHDL elaboration algorithm 500 is executed as described above. First, the VHDL component is constructed, along with the generics, ports, and other internal objects associated therewith. Components 802B, 802C, and 802D are then processed for construction. For VERILOG components 802C and 802D, only the generic values are passed in. The VERILOG components 802C and 802D are saved in the VERILOG CLCV. This is represented by FIG. 9. As shown, the VHDL component 802A is fully constructed and its generics have final values. The VHDL component 802B is fully constructed, its generics have final values passed in from the VHDL component 802A, and its ports are constructed with proper connections to the VHDL component 802A. The VERILOG component 802C is not fully constructed and its parameters do not have final values. Similarly, the VERILOG component 802D is not fully constructed and its parameters do not have final values. Notably, a portmap is created for each of the VERILOG components 802C and 802D.

Next, for each VERILOG component in the VERILOG CLCV (e.g., VERILOG components 802C and 802D), the VERILOG elaboration algorithm 600 is executed. The VERILOG elaboration algorithm 600 attempts to construct all of the VERILOG modules first recursively. The VHDL components 802F and 802G are added to the VHDL CLCV. After all of the VERILOG modules and parameters inside for each sub-tree have been constructed, the VERILOG parameters are settled to finalize the parameters. Then the VHDL to VERILOG port connection is made for each of the VERILOG components 802C and 802D using the saved portmaps. Then internal objects, such as signal, reg, and wire are constructed for the VERILOG components 802C and 802D.

This is illustrated in FIG. 10. As shown, the VERILOG component 802C is now fully constructed, its ports are constructed and are connected to the VHDL component 802A, and its parameters have final values passed in from the VHDL component 802A. The VERILOG component 802D is also now fully constructed, its ports are constructed and are connected to the VHDL component 802B, and its parameters have final values passed in from the VHDL component 802B. The VERILOG component 802E is fully constructed, its ports are constructed and are connected to the VERILOG component 802C, and its parameters have final values passed in from the VERILOG component 802C. The VHDL components 802F and 802G are not yet constructed and their generics do not yet have final values.

Next, the VERILOG CLCV is empties. Then, for each VHDL component n the VHDL CLCV (e.g., VHDL components 802F and 802G), parameters are passed in from their VERILOG parents, their ports are constructed and connections are established, and their internal objects are constructed. The VHDL CLCV is then emptied. Since both the VERILOG CLCV and the VHDL CLCV are now empty, the algorithm ends. The result is shown in FIG. 8.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

We claim:

1. A method of processing a circuit description for logic simulation, the circuit description having a hierarchy of components, each component in the hierarchy being described using one of a first hardware description language (HDL) or a second HDL, the method comprising:

selecting a component in the hierarchy as a root component;

elaborating the root component and each component in the hierarchy below the root component described using an HDL identical to that of the root component up to a cross-language boundary, the root component being described using one of the first HDL or the second HDL and each component at the cross-language boundary being described using the other of the first HDL or the second HDL;

storing each component at the cross-language boundary in one of a first vector associated with the first HDL or a second vector associated with the second HDL based on language; and establishing a connection between each component at the cross-language boundary and a respective parent component in the hierarchy.

2. The method of claim 1, further comprising:

removing another component from one of the first vector or the second vector;

performing the steps of elaborating and establishing using the other component as the root component; and repeating the steps of removing and performing until each of the first vector and the second vector is empty.

3. The method of claim 1, wherein the step of establishing comprises, for each connection:

assigning values to generics or parameters; and connecting signals to ports.

4. The method of claim 1, wherein the first HDL is VHDL and the second HDL is VERILOG, and wherein the step of elaborating comprises:

if the root component is described using VHDL, creating a portmap for each component at the cross-language boundary.

5. The method of claim 4, wherein the connection between each component at the cross-language boundary and the respective parent is established using a respective portmap if each component at the cross-language boundary is described using VERILOG.

6. The method of claim 4, wherein the portmap for each component at the cross-language boundary comprises a list configured to map signals to ports.

7. The method of claim 1, wherein the first HDL is VHDL and the second HDL is VERILOG, and wherein, if the root component is described using VHDL, the step of elaborating comprises:

constructing the root component;

constructing a component instantiated in an architecture of the root component;

if the component is described using VHDL, connecting first VHDL signals to first VHDL ports;

repeating the steps of constructing the component and connecting first VHDL signals to first VHDL ports until each component instantiated in the architecture has been selected.

8. The method of claim 7, wherein, if the root component is described using VERILOG, the step of elaborating comprises:

constructing VERILOG modules in the root component and each component in the hierarchy below the root component described using VERILOG;

settling VERILOG parameters;

constructing VERILOG objects and VERILOG processes; and connecting first VERILOG signals to first VERILOG ports.

9. The method of claim 8, wherein the step of connecting first VHDL signals to first VHDL ports comprises:

if the component is described using VERILOG, generating portmap data associated with the component, the portmap data associating second VERILOG ports of the component with second VHDL signals of a parent VHDL component to the component.

10. The method of claim 9, wherein the step of establishing comprises:

using the portmap data to connect the second VHDL signals to the second VERILOG ports.

11. A computer readable medium having stored thereon software for processing a circuit description for logic simulation, the software comprising:
- code for selecting a component in a hierarchy of components as a root component, wherein each component in the hierarchy is described using one of a first hardware description language (HDL) or a second HDL;
- code for elaborating the root component and each component in the hierarchy below the root component described using an HDL identical to that of the root component up to a cross-language boundary, the root component being described using one of the first HDL or the second HDL and each component at the cross-language boundary being described using the other of the first HDL or the second HDL;
- code for storing each component at the cross-language boundary in one of a first vector associated with the first HDL or a second vector associated with the second HDL based on language; and
- code for establishing a connection between each component at the cross-language boundary and a respective parent component in the hierarchy.

12. The computer readable medium of claim 11, further comprising:
- code for removing another component from one of the first vector or the second vector;
- code for performing the steps of elaborating and establishing using the other component as the root component; and
- code for repeating the steps of removing and performing until each of the first vector and the second vector is empty.

13. The computer readable medium of claim 11, wherein the first HDL is VHDL and the second HDL is VERILOG, and wherein the code for elaborating comprises:
- if the root component is described using VHDL, code for creating a portmap for each component at the cross-language boundary.

14. The computer readable medium of claim 13, wherein the connection between each component at the cross-language boundary and the respective parent is established using a respective portmap if each component at the cross-language boundary is described using VERILOG.

15. The computer readable medium of claim 11, wherein the first HDL is VHDL and the second HDL is VERILOG, and wherein, if the root component is described using VHDL, the code for elaborating comprises:
- code for constructing the root component;
- code for constructing a component instantiated in an architecture of the root component;
- if the component is described using VHDL, code for connecting first VHDL signals to first VHDL ports.

16. A system for processing a circuit description for logic simulation, the circuit description having a hierarchy of components, each component in the hierarchy being described using one of a first hardware description language (HDL) or a second HDL, the system comprising:
- a design entry tool for generating the circuit description; and
- a database for storing simulation engine functions; and
- a logic simulator having an elaborator for elaborating the circuit description and simulating the circuit description as elaborated using the simulation engine functions;
- wherein the elaborator is configured to:
  - select component in the hierarchy as a root component;
  - elaborate the root component and each component in the hierarchy below the root component described using an HDL identical to that of the root component up to a cross-language boundary, the root component being described using one of the first HDL or the second HDL and each component at the cross-language boundary being described using the other of the first HDL or the second HDL;
  - store each component at the cross-language boundary in one of a first vector associated with the first HDL or a second vector associated with the second HDL based on language; and
  - establish a connection between each component at the cross-language boundary and a respective parent component in the hierarchy.

17. The system of claim 16, wherein the elaborator is further configured to:
- remove another component from one of the first vector or the second vector;
- perform the functions of elaborating and establishing using the other component as the root component; and
- repeat the functions of removing and performing until each of the first vector and the second vector is empty.

18. The system of claim 16, wherein the elaborator is further configured to, for each connection:
- assign values to generics or parameters; and
- connect signals to ports.

19. The system of claim 16, wherein the first HDL is VHDL and the second HDL is VERILOG, and wherein the elaborator is further configured to:
- if the root component is described using VHDL, create a portmap for each component at the cross-language boundary.

20. The system of claim 19, wherein the connection between each component at the cross-language boundary and the respective parent is established using a respective portmap if each component at the cross-language boundary is described using VERILOG.

* * * * *